United States Patent
Redler

(10) Patent No.: US 10,291,011 B2
(45) Date of Patent: May 14, 2019

(54) AUTOMATIC, HIGHLY RELIABLE, FULLY REDUNDANT ELECTRONIC CIRCUIT BREAKER THAT REDUCES OR PREVENTS SHORT-CIRCUIT OVERCURRENT

(71) Applicant: Redler Technologies Ltd., Pardesia (IL)

(72) Inventor: Yesaiahu Redler, Pardesia (IL)

(73) Assignee: Redler Technologies Ltd., Pardesia (IL)

(*) Notice: Subject to any disclaimer, the term of this patent is extended or adjusted under 35 U.S.C. 154(b) by 33 days.

(21) Appl. No.: 15/705,978

(22) Filed: Sep. 15, 2017

(65) Prior Publication Data
US 2018/0083435 A1    Mar. 22, 2018

Related U.S. Application Data

(63) Continuation-in-part of application No. PCT/IL2016/050281, filed on Mar. 14, 2016.

(30) Foreign Application Priority Data

Mar. 16, 2015  (IL) .......................................... 237775

(51) Int. Cl.
| | |
|---|---|
| *H02H 3/05* | (2006.01) |
| *H02H 3/08* | (2006.01) |
| *H02H 9/02* | (2006.01) |
| *H03K 17/687* | (2006.01) |
| *G01R 31/02* | (2006.01) |
| *H02H 3/087* | (2006.01) |

(52) U.S. Cl.
CPC ............ *H02H 3/05* (2013.01); *G01R 31/025* (2013.01); *H02H 3/08* (2013.01); *H02H 3/085* (2013.01); *H02H 3/087* (2013.01); *H02H 9/02* (2013.01); *H03K 17/687* (2013.01)

(58) Field of Classification Search
None
See application file for complete search history.

(56) References Cited

U.S. PATENT DOCUMENTS

| | | | |
|---|---|---|---|
| 5,761,019 A | 6/1998 | Kroll | |
| 2012/0257311 A1 | 10/2012 | Burns et al. | |
| 2013/0049686 A1* | 2/2013 | Erhart | H02H 9/025 320/109 |

FOREIGN PATENT DOCUMENTS

| | | |
|---|---|---|
| CN | 101692574 A | 4/2010 |
| WO | 9725761 A1 | 7/1997 |

* cited by examiner

*Primary Examiner* — Clayton E. LaBalle
*Assistant Examiner* — Jas A Sanghera
(74) *Attorney, Agent, or Firm* — The Webb Law Firm

(57) ABSTRACT

A programmable power (PPSE) switching element including a front power transistor, a main switching transistor, and at least one reverse current blocking transistor in series, a gate of each of which is connected to a gate driver; an inductor and a shunt resistor connected in series with the transistors; a charge storage capacitor connected between ground and a junction located between the inductor and the shunt resistor; a high-speed NPN transistor, a collector of which is connected to the front power transistor and an emitter of which is connected to an output of the main switching transistor via the shunt resistor; a current measurement element in parallel to the shunt resistor; a voltage amplifier; and a high-speed MCU.

19 Claims, 8 Drawing Sheets

AUTOMATIC, HIGHLY RELIABLE, FULLY REDUNDANT ELECTRONIC CIRCUIT BREAKER THAT REDUCES OR PREVENTS SHORT-CIRCUIT OVERCURRENT

CROSS-REFERENCE TO RELATED APPLICATIONS

This application is filed under 35 U.S.C. 111(a) and C.F.R. 1.53 as a Continuation-in-Part of International (PCT) Pat. Appl. No. PCT/IL2016/050281, filed 14 Mar. 2016, and claims priority from Israel Pat. Appl. No. 237775, filed 16 Mar. 2015, each of which is incorporated herein by reference in its entirety.

FIELD OF THE INVENTION

Disclosed embodiments relate in general to electronic fuses, and in particular, to programmable electronic fuses that reduce or prevent high current flow under short circuit conditions, eliminate power source current surges, reduce or prevent switching element destruction, and increase total fuse reliability.

BACKGROUND OF THE INVENTION

Conventional Programmable Power Switching Systems (PPSS) and Programmable Power Switching Elements (PPSE) and methods are used for both AC and DC current applications. Such systems are variously known as "smart power switches," "protection systems," "electronic fuses," etc. Most of the systems currently known in the art are directed to detection of short circuits or open loads and to the subsequent execution of steps to protect and isolate the energy source and the load branch. These systems fail to provide any protection or redundancy within the relevant switch if the MOSFET malfunctions, however. Moreover, if there is a delay between the detection of the short circuit and the disconnection of the load branch from the energy source, the MOSFET, the shorted load, and the power source are exposed to the overcurrent, which may reduce the entire system voltage or even melt the MOSFET.

The systems currently on the market mainly comprise mechanical, thermal, and magnetic fuses. More recently, electronic fuses based on MOSFETs, SiC MOSFETs, IGBTs, power transistors, and SCR/Triac have been developed. These conventional systems can detect a short circuit and then disconnect the load from the voltage source, but until the disconnection has been completed, the voltage source and the MOSFET(s) absorb a high current. The relatively high internal resistance of batteries and fuel cells puts constraints on the system reliability, however, because these types of fuses cannot act quickly enough to prevent the battery from experiencing a high current surge from which the fuses are damaged.

For example, if the energy source is a 24 V battery with an internal resistance of 0.5Ω, a short circuit of 50 A for 1 mSec causes a short to the battery, causing some or all loads in the electric switching system to lose energy. Due to the high short circuit current, connecting capacitors near the battery does not provide a practical solution to the problem.

Similarly, if the energy source is, for example, a 24 V vehicle battery with an internal resistance of 1 mΩ connected to a MOSFET having an internal resistance of 5 mΩ, a short circuit conducts a current of 24 V/0.006Ω=4000 A. Thus, a delay prior to detection of the short circuit of 1 ms causes a short to the battery, causing some or all loads in the electric switching system to lose energy. Due to the high short circuit current, the MOSFET is melted.

In cases in which the power source has a high impedance, power switching systems known in the art generally introduce significant undesired surge current into the circuit. On the other hand, in cases in which the power source is a very low impedance battery or power supply, a short circuit produces a high current, at least transiently. A typical circuit that includes a MOSFET cannot handle such a transient high current (on the order of thousands of amperes) even for 1 µs. Such an event melts the transistor and permanently shorts the load.

Therefore, there is a need in the art for a PPSS/PPSE that overcomes some or all of the deficiencies of the prior art.

SUMMARY OF THE INVENTION

Non-limiting embodiments or aspects provide a PPSS and PPSE, for example, in the form of an improved electronic fuse, that rapidly isolates an energy source from a load branch under either short circuit or open load conditions, thereby protecting the energy source and switching elements from transient high currents produced under such conditions; that insures the reliability and isolation of a MOSFET; and/or that fits into a standard fuse holder, which solves a long-felt, yet unmet, need.

According to a non-limiting embodiment or aspect, provided is a programmable power switching element (PPSE), wherein said PPSE comprises: a first terminal; a front power transistor (103) comprising a drain connected in series to said first terminal, a source, and a gate; a first gate driver (104) connected to said gate of said front power transistor; a main switching transistor (108) connected in series with said front power transistor, said main switching transistor comprising a drain, said drain connected to said source of said front power transistor; a first reverse current blocking transistor (102), comprising a drain, a source, and a gate, said first reverse current blocking transistor connected in series with and located between said front power transistor and said main switching transistor, the gate of said first reverse current blocking transistor connected to said first gate driver; a second gate driver (106) connected to said gate of said main switching transistor; a shunt resistor (114) connected in series with said main switching transistor; a junction (119) between said source and said shunt resistor; a second terminal (116) in series with said shunt resistor; a second reverse current blocking transistor (111), comprising a drain, a source, and a gate, said second reverse current blocking transistor connected in series with and located between said main switching transistor and said shunt resistor, the gate of said first reverse current blocking transistor connected to a gate driver; a charge storage capacitor (113) connected between ground and said junction; an inductor (112) located between said source and said charge storage capacitor; an NPN transistor (115) comprising a collector and an emitter, said collector connected to said gate of said front power transistor and said emitter connected to said second terminal via said shunt resistor and said inductor; a current measurement element (120) comprising a bidirectional shunt voltage amplifier, said current measurement element connected in parallel with said shunt resistor; and, a high-speed microcontroller unit (MCU) (118) comprising a high-speed A/D converter connected to said transistors, to said charge storage capacitor, and to said voltage amplifier.

In one non-limiting embodiment or aspect, said inductor (112) is connected in series with said second reverse current blocking transistor and located between said second reverse current blocking transistor and said shunt resistor, and said charge storage capacitor (113) connected between ground and a junction located between said inductor and said shunt resistor.

In one non-limiting embodiment or aspect, the PPSE additionally comprises a high speed memory device (110) configured to identify a short circuit condition and to electrically disconnect said transistors (108, 111) from a source of electrical current. In some particularly preferred embodiments of the invention, said high speed memory device is configured to disconnect said transistors within 200 ns of an occurrence of a short circuit condition.

According to a non-limiting embodiment or aspect, provided is a programmable power switching element (PPSE), wherein said PPSE comprises: a first terminal; a first main switching transistor (141) comprising a drain connected in series to said first terminal, a source, and a gate; a gate driver (144) connected to said gate of first main switching transistor; a second main switching transistor (145) connected in series with said first main switching transistor, said main switching transistor comprising a drain, said drain connected to said source of said first main switching transistor; a shunt resistor (149) connected in series with said inductor; a junction (153) between said source and said shunt resistor; a charge storage capacitor (148) connected between ground and said junction; an inductor (147) located between said source and said charge storage capacitor; a second terminal (116) connected in series to said shunt resistor; an NPN transistor (150) comprising a collector and an emitter, said collector connected to said gate of said front power transistor, and said emitter connected to said second terminal via said shunt resistor and said inductor; a current measurement element (151) comprising a voltage amplifier connected in parallel to said shunt resistor; and, a high-speed MCU (146), comprising a programmable delay unit and a high-speed A/D converter connected to said transistors, to said charge storage capacitor, and to said voltage amplifier.

In one non-limiting embodiment or aspect, said inductor (147) is connected in series with said second main switching transistor, said shunt resistor (149) is connected in series with said inductor, and said charge storage capacitor (148) is connected between ground and a junction located between said inductor and said shunt resistor.

In one non-limiting embodiment or aspect, provided is a PPSE as defined in any of the above, wherein at least one of said transistors is a MOSFET.

In one non-limiting embodiment or aspect, provided is a PPSE as defined in any of the above, wherein said PPSE comprises said first terminal is connectable to a voltage source and said second terminal is connectable to a load.

In one non-limiting embodiment or aspect, provided is a PPSE as defined in any of the above, wherein said gate of said first reverse current blocking transistor is connected to said first gate driver (104).

In one non-limiting embodiment or aspect, provided is a PPSE as defined in any of the above, wherein said gate of said second reverse current blocking transistor is connected to said second gate driver (106).

In one non-limiting embodiment or aspect, provided is a PPSE as defined in any of the above, wherein said inductor has an inductance of between 10 nH and 100 μH. In preferred embodiments, said inductor has an inductance of between 10 nH and 500 nH.

In one non-limiting embodiment or aspect, provided is a PPSE as defined in any of the above, wherein said charge capacitor has a capacitance of between 1 and 50 μF.

In one non-limiting embodiment or aspect, provided is a PPSE as defined in any of the above, wherein said NPN transistor (115) is characterized by an FT of at least 200 MHz. In some preferred embodiments of the invention, said NPN transistor (115) is characterized by an FT of about 300 MHz.

In one non-limiting embodiment or aspect, provided is a PPSE as defined in any of the above, wherein said MCU is programmed to read a voltage drop across said charge storage capacitor; read a voltage rise on said current measurement element; store predetermined current limits for said system; detect a value and a waveform of current flowing through said system; and to send a signal to said front power transistors to direct said front power transistors to open or close.

In one non-limiting embodiment or aspect, provided is a PPSE as defined in any of the above, wherein said MCU is programmed to measure a current waveform and to correlate said current waveform with a system status. In some preferred embodiments of the invention, said system status is selected from the group consisting of normal operation; short circuit; and motor stall.

In one non-limiting embodiment or aspect, provided is a PPSE as defined in any of the above, wherein said MCU comprises: flash memory; RAM; non-volatile memory; at least one charge pump driver; UART; SPI; an analog to digital converter; and, a board level interface.

In one non-limiting embodiment or aspect, provided is a PPSE as defined in any of the above, wherein said electronic fuse comprises exactly one main switching transistor.

In one non-limiting embodiment or aspect, provided is a PPSE as defined in any of the above, wherein said electronic fuse comprises two main switching transistors connected in series source to source.

In one non-limiting embodiment or aspect, provided is a PPSE as defined in any of the above, wherein said electronic fuse is characterized by standard fuse dimensions.

In one non-limiting embodiment or aspect, provided is a PPSE as defined in any of the above, wherein said electronic fuse is configured to fit in a housing selected from the group consisting of a standard fuse holder and a PCB-mountable housing.

In one non-limiting embodiment or aspect, provided is a Programmable Power Switching System (PPSS) comprising: an energy source (200); a plurality of PPSEs as defined in any of the above connected to said energy source; and, an MCU (204) configured to transmit to and receive from signals from said MCUs of said plurality of PPSEs. In some preferred embodiments of the PPSS, said energy source is a battery.

In one non-limiting embodiment or aspect, provided is a method for determining a location of a short circuit in a system comprising a voltage source and at least one branch current load, comprising: obtaining a PPSE as defined in any of the above; inserting said electronic fuse into said system between said voltage source and said at least one branch current load; determining an initial voltage $V_0$ across said charge storage capacitor; determining an electrical resistance of said system $R_d$ as a function of distance from said electronic fuse; determining a capacitance C of said system; using said electronic fuse to open said circuit upon occurrence of said short circuit; determining a voltage across said charge storage capacitor at at least one point in time t following said step of using said electronic fuse to open said circuit; determining a resistance R according to $V_t = V_0 e^{-t/RC}$, where $V_t$ is the voltage across said charge storage capacitor at time t; and, determining said location by calculating $R/R_d$.

BRIEF DESCRIPTION OF THE DRAWINGS

The invention will now be described with reference to the drawings, wherein.

DESCRIPTION OF THE INVENTION

In the following description, various aspects of the invention will be described. For the purposes of explanation, specific details are set forth in order to provide a thorough understanding of the invention. It will be apparent to one skilled in the art that there are other embodiments of the invention that differ in details without affecting the essential nature thereof. Therefore the proper scope of the invention is to be understood only as indicated in the accompanying claims, and determined only by the broadest interpretation of said claims.

As used herein, with regard to numerical quantities, the term "about" refers to a value within ±25% of the nominal value.

The electronic fuse (Programmable Power Switching Element or PPSE) disclosed herein enables measurement, management, control, protection, and isolation of branch loads from the energy source along with high surge current limits of the current that passes through the circuit and transistors. A plurality of transistors in series protects and isolates the energy source from any short circuit that may occur as well as from any overcurrent that might occur on one the branch circuits. In some preferred embodiments, the PPSE comprises a pair of transistors in series. In some other preferred embodiments, the PPSE comprises four transistors in series. As described in detail below, the PPSE disclosed herein is fully usable in both DC and AC systems, and enables sensing of current flow in any direction through the circuit, any voltage polarity, and both positive and negative disconnection.

Figure 1:
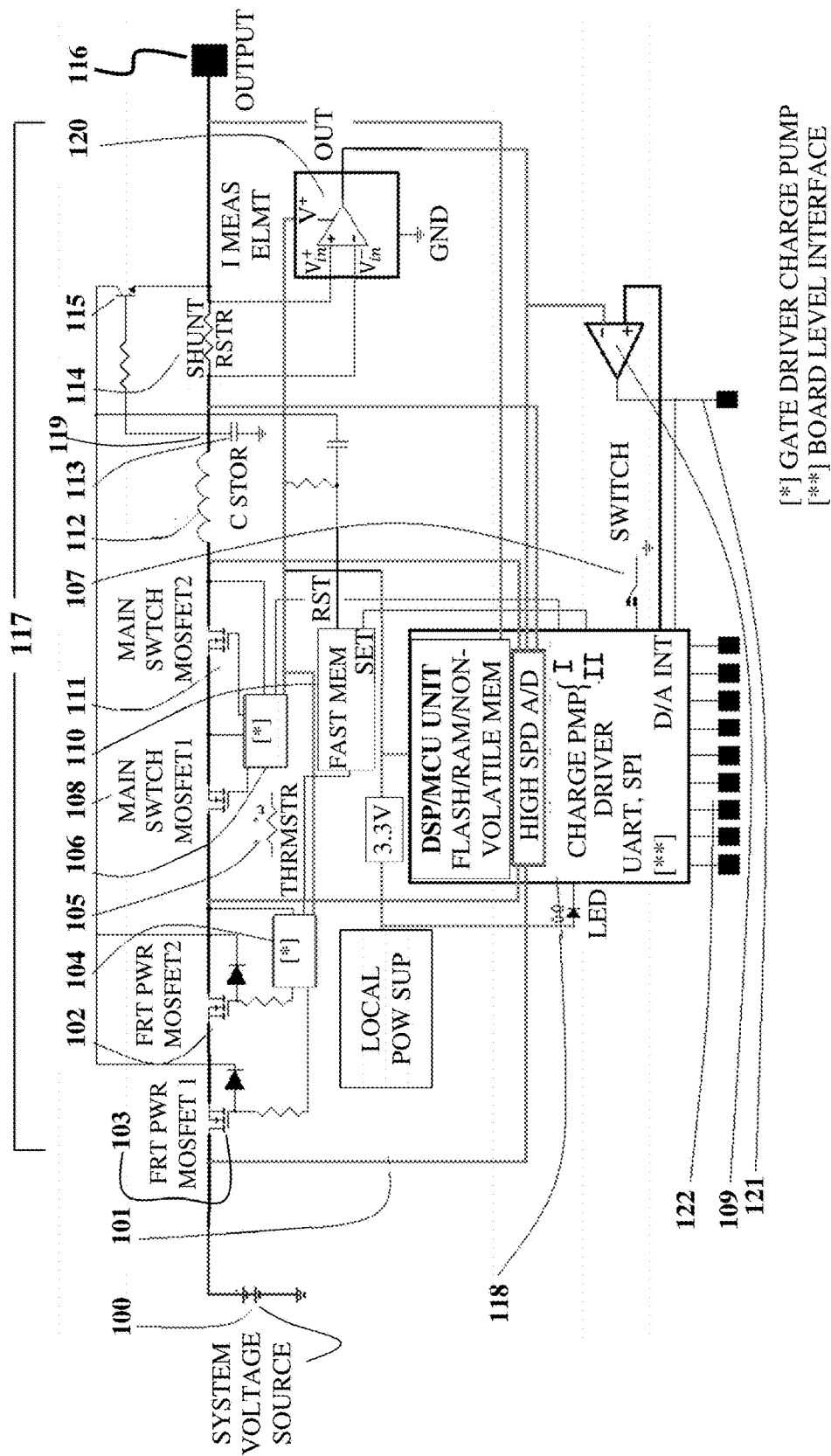
FIG. 1 presents a schematic circuit diagram of one embodiment of the PPSE of the present invention.

Reference is now made to FIG. 1, which presents a schematic circuit diagram of one embodiment of the PPSE disclosed herein. The PPSE is connected to a voltage source 100 that is characterized by an internal resistance $R_{source}$ and which delivers energy to at least one branch circuit 117. In preferred embodiments, the PPSE comprises four transistors connected in series: front power transistor 103, first reverse current blocking transistor 102, main switching transistor 108, and second reverse current blocking transistor 111. The PPSE also comprises at least one gate driver; in preferred embodiments, the PPSE comprises a first gate driver 104 and a second gate driver 106. In preferred embodiments of the invention, each gate driver is combined with a charge pump. In some preferred embodiments of the invention, the gate drivers are galvanically isolated.

Front power transistor 103 is connected to the voltage source. The source of front first reverse current blocking power transistor 102 is connected to the source of front power transistor 103, while the drain of first reverse current blocking power transistor 102 is connected to the drain of main switching transistor 108. The source of main switching transistor 108 is connected to the source of the second reverse current blocking transistor 111.

The gates of the transistors are connected to the gate drivers. In preferred embodiments, the gates of the front power transistor and the first reverse blocking transistor are connected to first gate driver 104, while the gates of the main switching transistor and the second reverse blocking transistor are connected to second gate driver 106. The gate drivers may operate either in an autonomous mode or under control of MCU 118. Because of the stringent timing conditions of the system, in particular, the timing of on/off signals as described in detail below, a high-speed MCU with a high-speed A/D converter may be used for operation of the PPSE disclosed herein. A low-inductance inductor 112, which in typical embodiments has an inductance of between 10 nH and 100 µH and in preferred embodiments 10-500 nH, is located between the voltage source and a shunt resistor 114, thereby being charged to the load voltage. In preferred embodiments of the invention, inductor 112 is connected in series with the drain of the second reverse blocking transistor. The PPSE also comprises a low ESR charge storage capacitor 113 having capacitance $C_{store}$ (in typical embodiments of the invention, $C_{store}$ is in the range of 1-50 µF) that in some non-limiting embodiments is connected between ground and a junction 119 located between inductor 112 and resistor 114.

In preferred embodiments of the invention, the PPSE also includes a high speed memory device 110 that is configured to identify a short circuit condition and to electrically disconnect said transistors (108, 111) from the source of electrical current, as described in detail below. In some particularly preferred embodiments of the invention, said high speed memory device is configured to disconnect said transistors within 200 ns of an occurrence of a short circuit condition.

The transistors used in the PPSE can be any kind of semiconductor switching element such as transistors, FETs, MOSFETs, IGBTs, SIC transistors, SCR/triacs, etc. In preferred embodiments of the invention, transistors 102, 103, 108, and 111 are MOSFETs.

When the PPSE connects the voltage source to the load, MCU 118 opens front power transistor 103 and first reverse current blocking transistor 102 to main switching transistor 108 and second reverse current blocking transistor 111.

The gate driver/charge pump 104 is turned on at this stage and the front power transistors start to conduct (with no current drain). After a short period of time (typically 1-3 µs), the MCU 118 opens main switching transistor 108 and second reverse current blocking transistor 111 and connects the source to PPSE output 116, transferring power to the load. Since the front power transistor and first reverse current blocking transistor are already open, the switching energy loss may appear only on the main switching transistor and the first reverse blocking transistor. The MCU reads the voltage drop across shunt resistor 114 and current flows normally.

Under normal operating conditions, current flow through the power transistors is measured by the shunt resistor and a bidirectional current measurement element 120 and the MCU 118. For system level power management, the PPSS can interrogate by serial or other communication means each of the PPSEs. When a moderate current rise short circuit occurs, the PPSE shuts the transistors and informs the PPSS (e.g. by sending an interrupt signal). The system continues to operate in this mode unless a rapid current rise short circuit occurs that causes a rapid response from the PPSE to reduce or prevent damage to the voltage source and the transistors.

When an abrupt or rapid current rise short circuit occurs, the PPSE output is shorted to ground, and the current rises through the shunt resistor 114. This current is measured by current measurement element 120. The current rise on the current measurement element is converted to voltage and amplified by a high speed, high common mode bidirectional current to voltage amplifier, the output of which is connected to the high speed A/D converter of the MCU. This process is very effective for slow rise time short circuit conditions, such as, for example, a short at a remote point, but even with a very fast shunt amplifier and A/D converter or comparator, it will be too slow to be of practical use. In the case of a nearby short circuit, however, the low resistance path from the power source to the short location would carry a transient current of thousands of amperes, melting the fuse and burning or melting the transistors, as discussed above. In order to protect the transistors, in the PPSE of the present invention, an inductor and capacitor are added to the high current path. The current is supplied to the load by transistors which feed inductor 112 and charge storage capacitor 113.

Due to the rapid current rise, inductor 112 experiences high impedance Z ($Z=j\omega L$). For example, for an inductance of 100 nH and a short circuit that occurs over a time of 1 μs, the impedance Z will be $0.628\Omega[=(1)(2\pi\times10^6)(100\times10^{-9})]$. An impedance of this magnitude will limit the short circuit current in a 24 VDC power source to $24/0.628=38.2$ A. The rapid rise of the current yields a high impedance element that isolates the transistors from the load, so the transistors therefore do not experience the short circuit current. During this rapid current rise the short circuit current flows from storage capacitor 113 through the shunt resistor 114 to the short.

The rapid current flow on the shunt resistor 114 is supplied from storage capacitor 113, creating a voltage on the base emitter of NPN transistor 115 which in turn shuts the gate voltage of front power transistors 103 and 102 and resets the gate driver fast memory 110 (i.e. performs a high speed flip-flop), disconnecting transistors 108 and 111 from the source of current. In preferred embodiments, NPN transistor 115 is high speed (in preferred embodiments, FT>200 MHz; in more preferred embodiments, FT is about 300 MHz) in order to enable front power transistors 103 and 102 to shut down in less than 100 ns. This process is sufficiently fast that inductor 112 remains in a high impedance state to protect the supply voltage source and transistors 102, 103, 108, and 111 from the high short circuit current.

The PPSE obtains power for its operation from the drain of the front power transistor and regulates the internal power supply on board 101. Low-mass thermistors 105 (typically one or two) measure the temperature of the power transistors to allow a rapid response when the transistor temperature is near or above the maximum allowed temperature.

Figure 2:
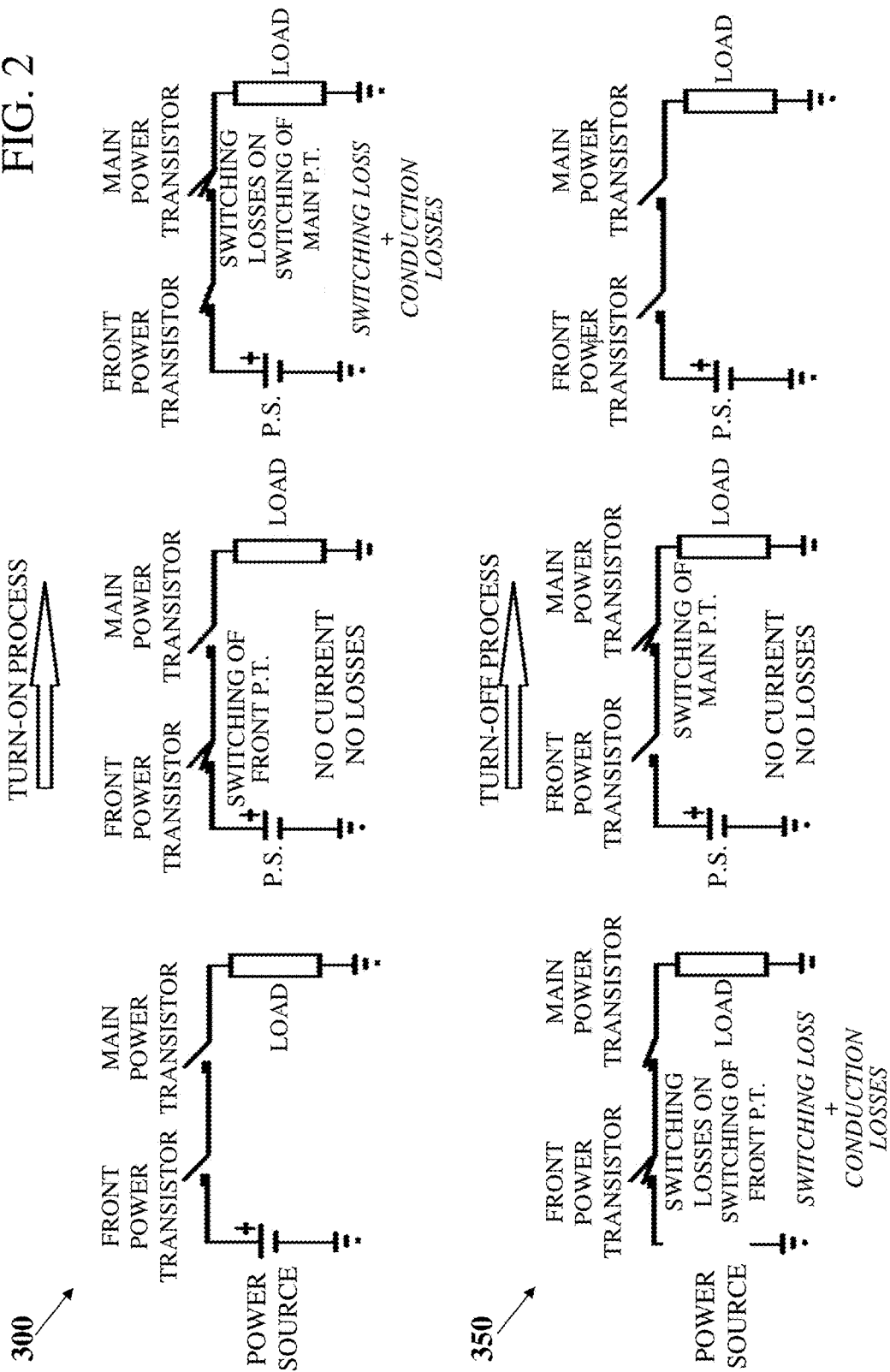
FIG. 2 presents diagrammatic illustrations of the turn-on and turn-off processes of one embodiment of the invention herein disclosed.

Reference is now made to FIG. 2, which shows schematically the turn-on and turn-off processes (300 and 350, respectively) of the PPSE of the present invention. During the turn-on process, transistors 108 and 111 absorb the switching losses in the turn-on process while transistors 103 and 102 absorb the turn-off switching losses. This configuration insures redundancy and enhances the overall reliability of the PPSE.

A novel design of the PPSE disclosed herein reduces or prevents any damage to the transistors and increases the total PPSE reliability sufficiently to make semiconductor systems practical for use as fuses in real-life applications. The PPSE can thus act as a fuse that disconnects the power source from the load completely. This functionality is achieved with the AC/reverse current block (transistors 102 and 111). If the PPSE is disconnected, the reverse current transistor block acts to block return current and the PPSE behaves like a normal fuse. In many DC applications, e.g. motor control, the PPSE can conduct a reverse current back to the power source. Embodiments intended for such applications do not comprise transistors 102 and 111 reverse current block; if the PPSE originally supplied was of an embodiment containing these elements, they can be removed or bypassed (e.g. by use of a short wire) for these types of DC applications.

In order to achieve the maximum cost effectiveness and reliability possible, each of the PPSE branch circuit fuses can operate in autonomous mode by operating under stored parameters inside the MCU 118. In this mode, the output of current measurement element 120 voltage amplifiers can be fed into analog comparator 109 and compared with a predetermined fixed value set by the local MCU 118 or by a fixed potentiometer, or it can be digitally controlled by using a non-volatile potentiometer and interrupt the PPSE MCU and (PPSS) via signals passed via connector 122. The previously described process by which high speed front power transistors 102 and 103 are disconnected and reconnected procedure is retained. The same interrupt can generate a PPSS interrupt 121 for complete system control.

The PPSE unit 117 obtains operating parameters from the PPSS and generates return data for complete system control via a serial bus and flags 122.

In preferred embodiments of the invention, the PPSE has a self-learning phase in which the load behavior of each branch is determined under short circuit conditions. In the self-learning phase, the MCU copies the waveforms and the time dependence of the current rise into the MCU memory. Optionally, the operator can deliberately produce conditions such as a motor stall or a short circuit so that the current waveforms in these conditions can be measured and stored as well. After the learning phase is completed, the MCU algorithm is capable of recognizing the expected current patterns and to act according to those patterns when an overcurrent situation occurs.

In some preferred embodiments of the invention, the local PPSE MCU is programmed to notify the PPSS processor of a short circuit or overcurrent situation.

In some preferred embodiments of the invention, the MCU is programmed to implement an automatic recovery algorithm. As a non-limiting example of the operation of an automatic recovery algorithm, if the current waveform indicates that a motor has stalled, the MCU increases the current before a short circuit occurs. In many cases, this procedure will cause the system to recover from the stall and return to normal. As another non-limiting example, if the system is used in an unmanned aerial vehicle (UAV), the MCU can be programmed to tighten the constraints on the definition of a short circuit condition in circumstances when the battery has nearly completely discharged.

Some preferred embodiments of the invention disclosed herein provide means for determining the location of a short circuit. During the learning phase, the transistors in series are put through connection/disconnection sequence with inductor 112 and charge capacitor 113 in order to determine the capacitor voltage, output voltage, charge, and current. The MCU can then compare the actual voltage and current values at time t with the values initially determined during the connection/disconnection sequence according to equations (1) and (2), where $V_t$ and $I_t$ are the charge and current on the charge storage capacitor at time t, $V_0$ is the initial voltage on the charge storage capacitor, R is the resistance of the wires in the system, and $C_{store}$ is the capacitance of the charge storage capacitor.

$$V_t = V_0 e^{-t/RC_{store}} \quad (1)$$

$$I_t = \frac{V_0}{R} e^{-t/RC_{store}} \quad (2)$$

Since $V_0$ and $C_{store}$ are known (the parasitic parallel capacitance and resistance can be measured at the time of installation of the electronic fuse or ignored as will in general be small relative to C), equation (1) can be solved for R by using the measured values of $V_t$. Comparing R under short-circuit conditions with R measured at the time of installation of the electronic fuse or calculated from the known resistance of the wires provides sufficient information to determine the location of the short circuit.

In some embodiments of the invention, determination of the location of a short circuit is performed by the use of a variable voltage generated at the output by use of a pulse-width modulated (PWM) signal. In these embodiments, due to the RLC architecture of the PPSE, the PPSE generates a variable voltage at the output that varies as a function of the PWM duty cycle. As non-limiting examples, if the input voltage is 24 V with a 10% duty cycle (i.e. the transistors conduct 10% of the time), the voltage at output 116 will be 5 V, while if the duty cycle is 90%, the voltage at output 116 will be 18 V. Thus, it is possible to produce a low voltage that will lower the short-circuit current, and to measure the short-circuit current even if the short circuit reduces the overall resistance by a few milliohms.

In this configuration, in the event of a short circuit, a known low current produced by a PWM signal of known duty cycle is injected into the circuit. Since the total resistance between the voltage source and the short circuit is given by the ratio of the output voltage to the short-circuit current and the resistance pre unit length of the wire is known, calculation of the location of the short circuit can readily be performed by measuring the current produced by the PWM signal, and calculating the total resistance from Ohm's Law and the distance to the short circuit from the resistance of the wire per unit length.

Figure 3:
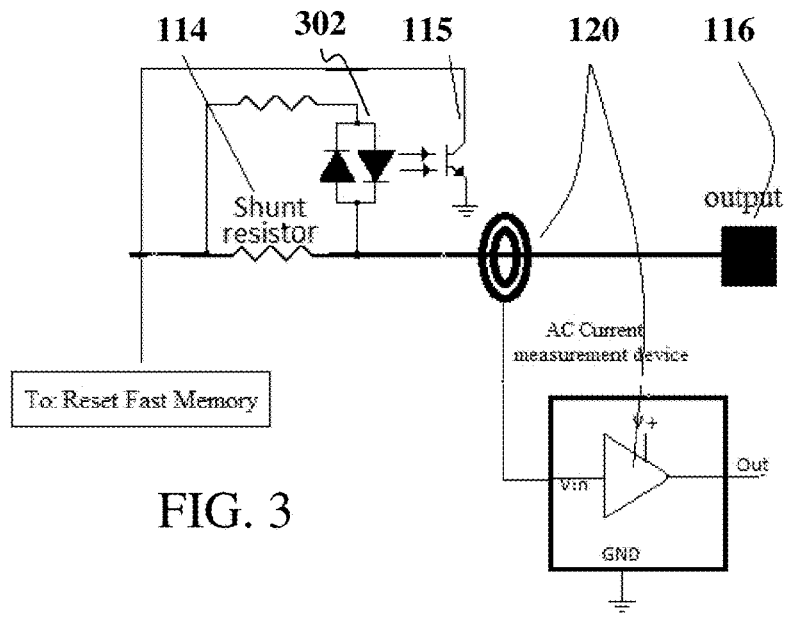
FIG. 3 presents a schematic circuit diagram of a portion of an embodiment of the PPSE of the present invention in which it is configured for short circuit detection in an AC system.

Reference is now made to FIG. 3, which provides a schematic diagram of a portion of one embodiment of the PPSE in which the PPSE is configured to detect a short circuit in an AC electrical system. In these embodiments, current measurement device 120 is configured to measure AC current, and NPN transistor 115 is a phototransistor that is optically coupled to a light source 302, thereby constituting a bidirectional input optocoupler. In preferred embodiments, the light source comprises two LEDs connected in parallel in opposite directions, as shown in the figure. When a short circuit occurs, whether on the positive portion or on the negative portion of the current waveform, a voltage drop occurs across the current sense resistor. When the voltage drop is greater than a preset level, the optocoupler starts to conduct, thereby causing the fast memory device to reset and to disconnect the switching transistors (108, 111) from the current source.

Figure 4:
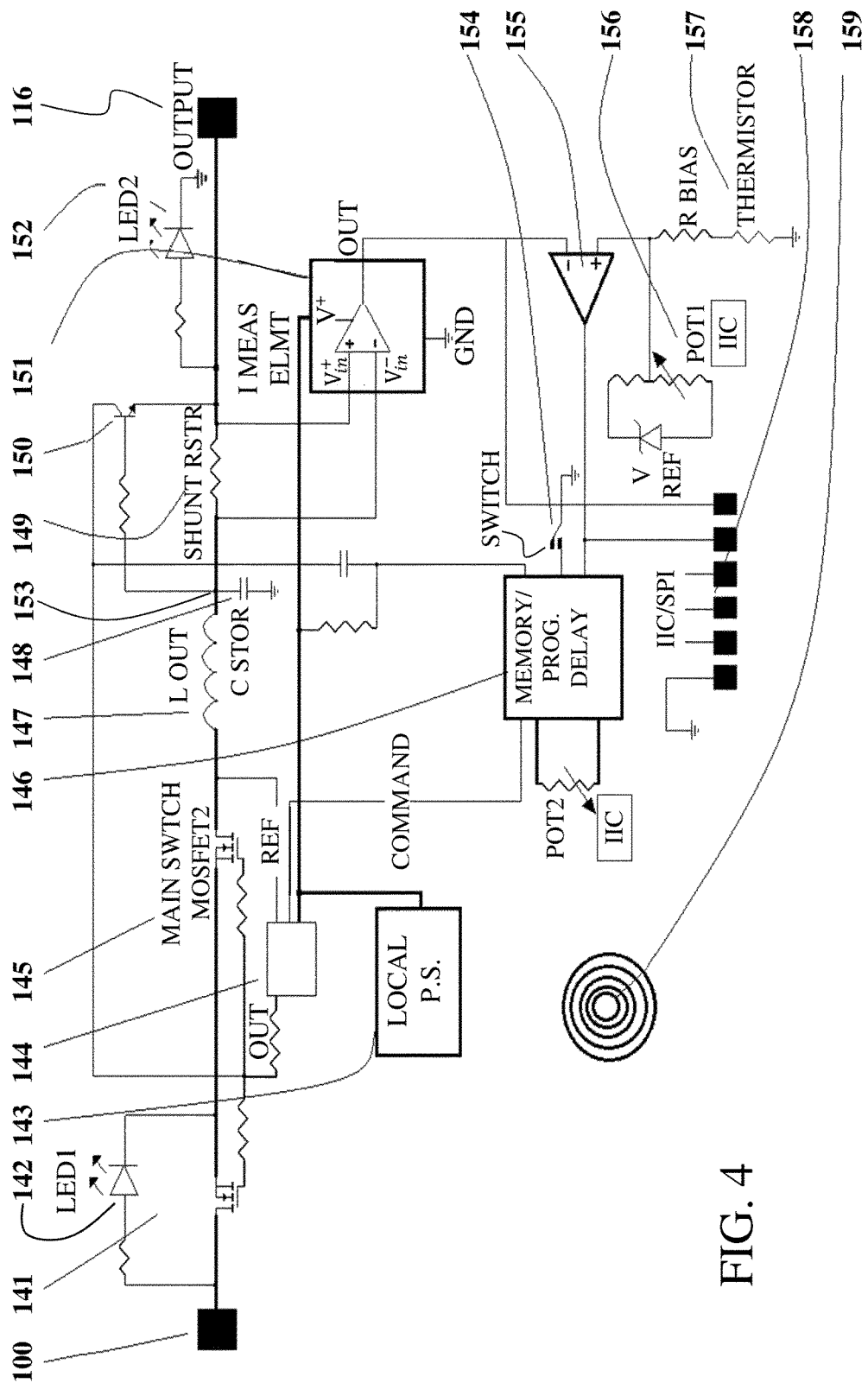
FIG. 4 presents a schematic circuit diagram of a second embodiment of the PPSE of the invention herein disclosed.

Reference is now made to FIG. 4, which provides a schematic diagram of an additional non-limiting embodiment of the electronic fuse disclosed herein. The embodiment comprises two transistors rather than four. In the embodiment illustrated in FIG. 4, the PPSE comprises two main power transistors (switching transistors 141 and 145). The second transistor 145 acts as the reverse current blocking transistor. In the event of a rapid rise time current surge caused by a short circuit, main switching power transistors 141 and 145 are disconnected by the overcurrent circuit via high-speed NPN transistor 150, which is located near shunt resistor 149. When this occurs, the internal memory is reset, and the main switching power transistors (141, 145) and gate driver 144 are shut down by a signal passed via programmable delay unit within MCU 146. Surge current protection in this reduced cost embodiment of the invention is provided by inductor 147 and storage capacitor 148, which protect the switching transistors 141, 145 from high current. In this embodiment of the PPSE, iductor 147, storage capacitor 148, and shunt resistor 149 are connected in a manner analogous to that of the embodiment depicted in FIG. 1. Embodiments comprising two transistors (as in FIG. 4) do not achieve the redundancy level of the four-transistor embodiment described previously, but nonetheless, the arrangement fully protects the switching transistor from high surge current.

As with the embodiments shown in FIG. 1, the embodiment of the PPSE shown in FIG. 4 will perform on-off switching within 100 ns (in preferred embodiments, within 50 ns). In contrast to those known in the art, however, the load current that supplies the PPSE will not have to supply surge current in the event of a short circuit due to the inductor L and the storage capacitor. Short circuit current is supplied via the storage capacitor until shutoff of the main switching transistors. During a "normal" rise time short circuit event, the current measurement element 151 will send the value of the current to comparator 155, which will trigger a programmable delay to shut down the main switching power transistors 141 and 145 to restart the connection after a predetermined period of time. The digital or analog potentiometers 156 and potentiometer POT2 of the programmable delay unit can adjust the circuit to various values of short circuit current level and reconnection delay time. In preferred embodiments of the invention, thermistor 157 is in connection with the trip current voltage to allow changes of the trip current if the transistor temperature varies, significantly increasing the overall reliability of the PPSE.

The embodiment shown in FIG. 4 can be used in an AC current system in a manner analogous to the embodiment shown in FIG. 1. Analogously to the embodiment shown in FIG. 1, current measurement element 151 is configured to measure AC current, and NPN transistor 150 is a phototransistor optically coupled to a light source (e.g. LED) 302 to form an optocoupler.

Data from the PPSE is made available to the PPSS via a connector 158 that conveys at least the following signals: current analog level; trip point threshold; signals to program the optional digital potentiometers; and signal ground in this standalone PPSE digital potentiometers data can be carried by a RF or contact less communication system 159.

Figure 5A:
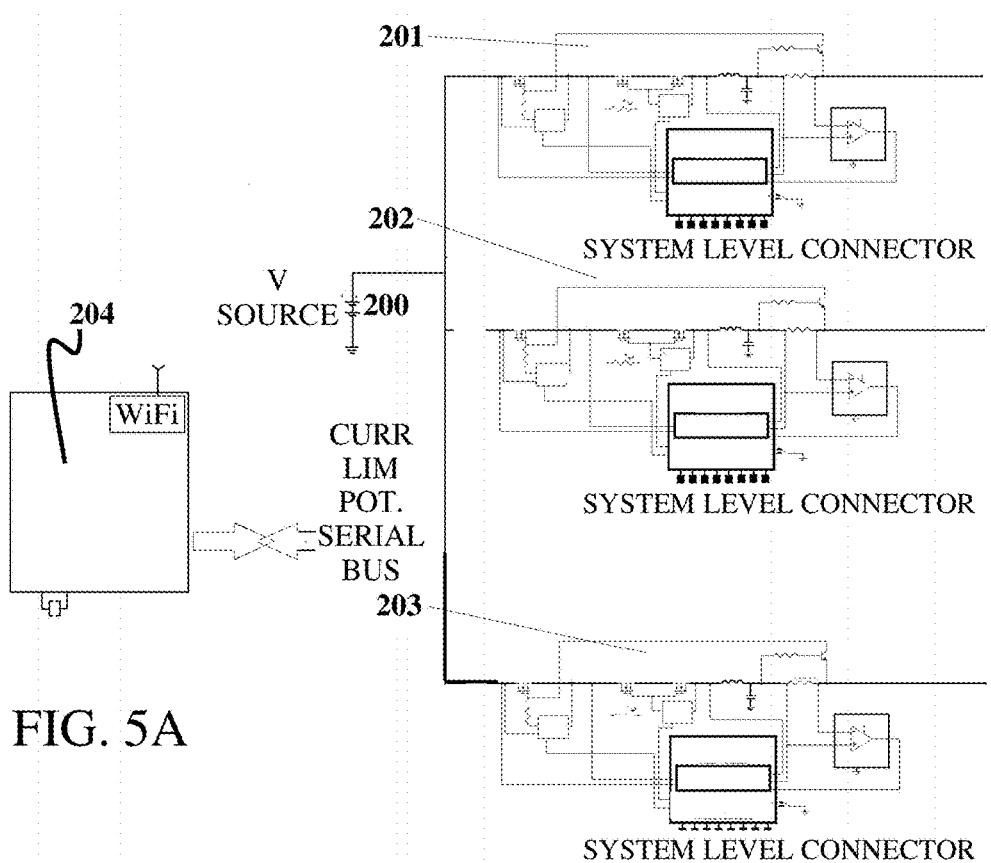
FIGS. 5A and 5B present schematic diagrams of a complete electric switching system that incorporates the invention herein disclosed.
Figure 5B:
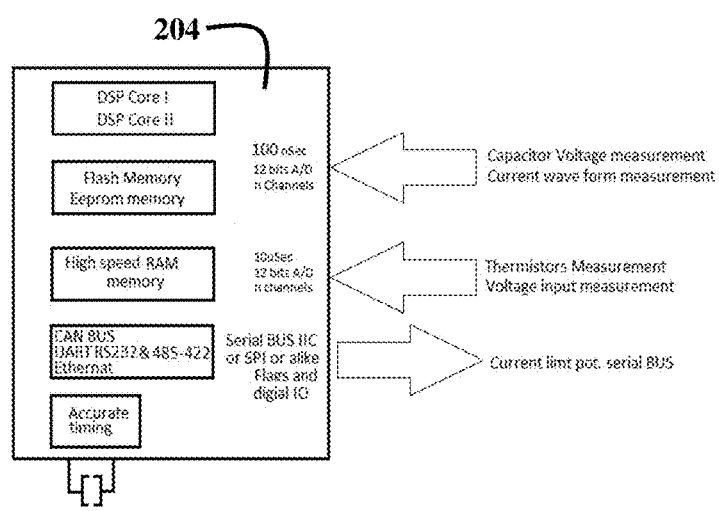

Reference is now made to FIG. 5, which provides a schematic diagram of one embodiment of a complete electric switching system PPSS that incorporates the electronic fuse disclosed herein. In the embodiment shown, energy source 200 is a battery, but any energy source known in the art may be used. The energy source is connected to a plurality of electronic fuses. In the embodiment illustrated (FIG. 5A), three electronic fuses 201, 202, and 203 are shown, but any number may be connected to the energy source. The embodiment illustrated comprises a single-level switching matrix. In other embodiments, the fuses can be implemented as a group or in a hierarchical fashion. The signals for control and reading are routed to the MCU FPGA or to a plurality of MCUs 204 (FIG. 5B).

Figure 6A:
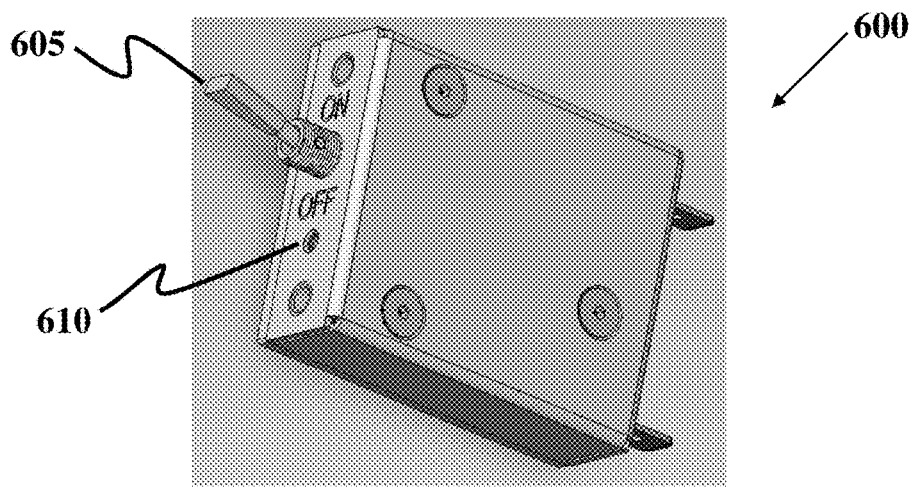
FIGS. 6A and 6B present side and rear views (not to scale) of one embodiment of a housing for the PPSE of the invention herein disclosed.
Figure 6B:
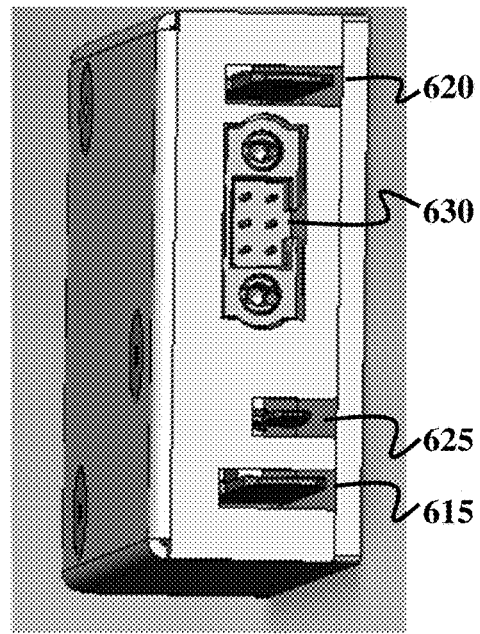

Another advantage of the electronic fuse disclosed herein is its small size. In preferred embodiments, the entire electronic fuse is of standard fuse dimensions and hence will fit into any standard fuse holder that has an internal volume of at least 0.75 cm$^3$. Reference is now made to FIG. 6, which shows schematic views of a non-limiting exemplary embodiment of a housing 600 for the PPSE herein disclosed. FIG. 6A shows a side view of the housing (not to scale). The front of the housing comprises on/off switch 605 and an indicator light 610 that is lit when the PPSE is in use. FIG. 6B shows a rear view of the housing, showing power in tab 615, power out tab 620, ground tab 625, and an optional communication and network connector 630 (tabs 615 and 620 can also be seen in FIG. 6A). A non-limiting example of a pin arrangement in the embodiment of the electronic fuse illustrated schematically in FIG. 6 is presented in Table 1.

TABLE 1

| Pin Number | Pin Name | Description |
| --- | --- | --- |
| 1 | Current IN | Current flow input signal, connected to power source side |
| 2 | Current OUT | Current flow output signal, connected to load side |
| 3 | GND | Ground signal |
| 4 | Serial CLK/SCL | 10 MHz SPI clock signal |
| 5 | Serial IN/SDA | Data in signal. SPI MOSI signal |
| 6 | Serial OUT/NC | Data out signal. SPI MISO signal |
| 7 | Fuse/POT select | Fuse or POT select active low signal |
| 8 | Status | LED driving signal duty cycle proportional to load current |
| 9 | DP | Short circuit carry signal, enables double protection scheme |

In preferred embodiments of the invention, the PPSE is characterized by dimensions that are standard for use in electrical panels; the exact dimensions of a particular PPSE are in general adapted to a specific application and will depend on the current carried by the application for which the PPSE is to be used. The PPSE of the present invention can thus be adapted to fit in any standard fuse holder for use in any circuit that can be protected by any type of fuse or circuit breaker currently known in the art. For example, the PPSE and/or an electronic fuse thereof may comprise dimensions according to IEC standards and/or UL standards.

Figure 7A:
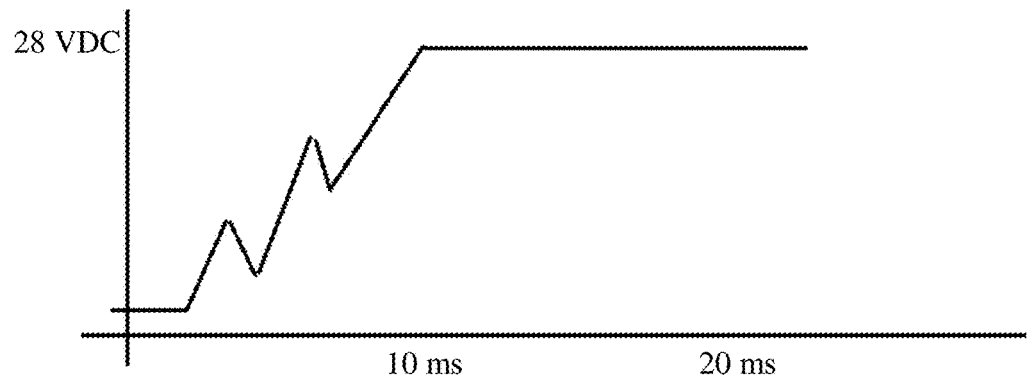
FIGS. 7A and 7B illustrate the voltage as a function of time at the power source and output, respectively, as an unstable power source connected to the PPSE of the invention herein disclosed ramps up to its final voltage.
Figure 7B:
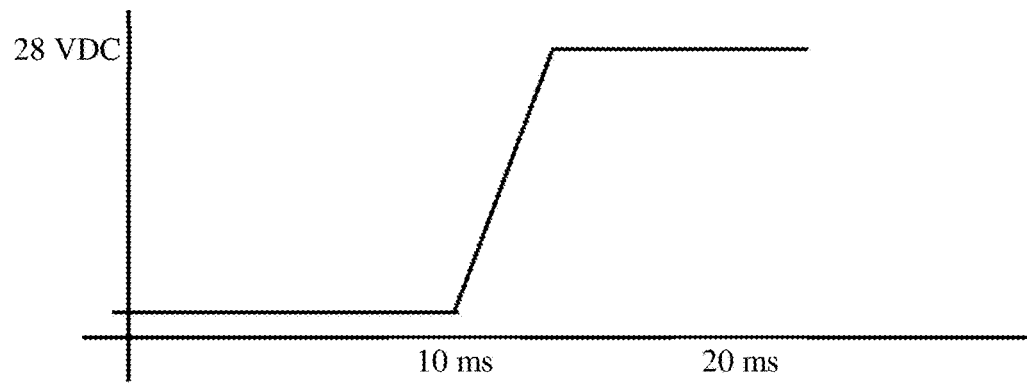

In a similar fashion to the above discussion of the use of PWM input signals in the determination of the location of a short circuit, in some embodiments of the invention, a PWM input signal is used in the case of unstable power on/off situations. In these embodiments, a voltage is produced at the output from a PWM input signal; as described above, the output voltage will vary depending on the PWM duty cycle, as will its rise time. In these embodiments, the fuse will produce the correct voltage ramp-up at the output even if the input ramp-up is unstable. Reference is now made to FIG. 7, which shows graphs of the voltage at the power source (FIG. 7A) and the output (FIG. 7B) as a function of time following the activation of an unstable power source. As shown in the graphs, even if the power source does not provide a smooth ramp-up during the ~10 ms it takes to reach its final voltage, the output will experience a smooth rise to its final voltage.

Reference is now made to FIG. 8, which presents results of simulations of the operation of the PPSE disclosed herein. The simulations were performed using the commercially available SPICE (Simulation Program with Integrated Circuit Emphasis) program. The simulations were performed on the simplified circuit shown in FIG. 8A.

Figure 8B:
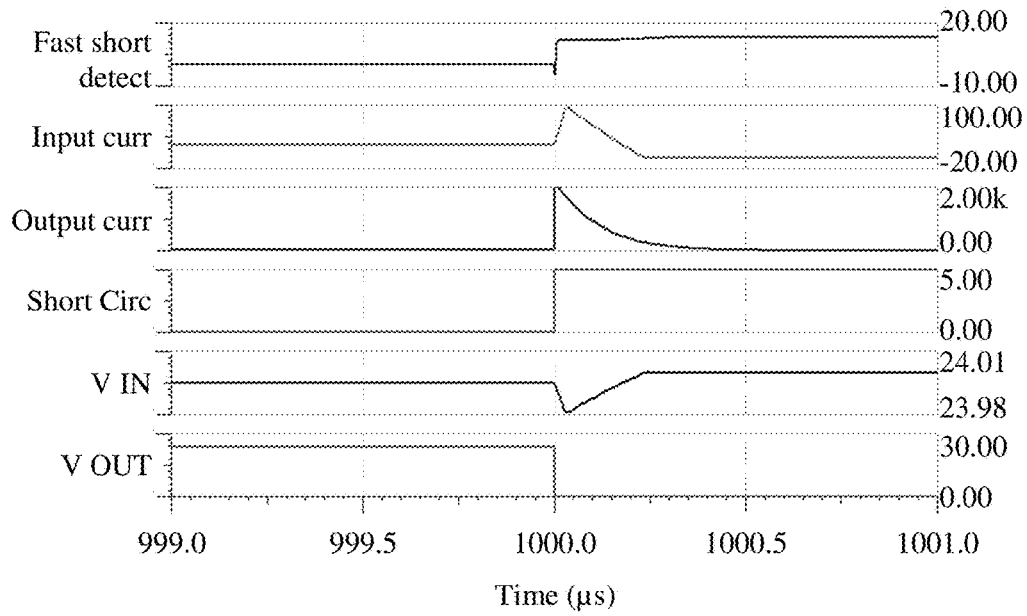
FIG. 8A presents a circuit diagram of a model that was used in simulations of the behavior of the PPSE of the invention herein disclosed; and, FIGS. 8B-8D present graphs of load current, capacitor voltage, and voltage waveform as a function of time for various short circuit conditions as simulated using the circuit shown in FIG. 8A.
Figure 8A:
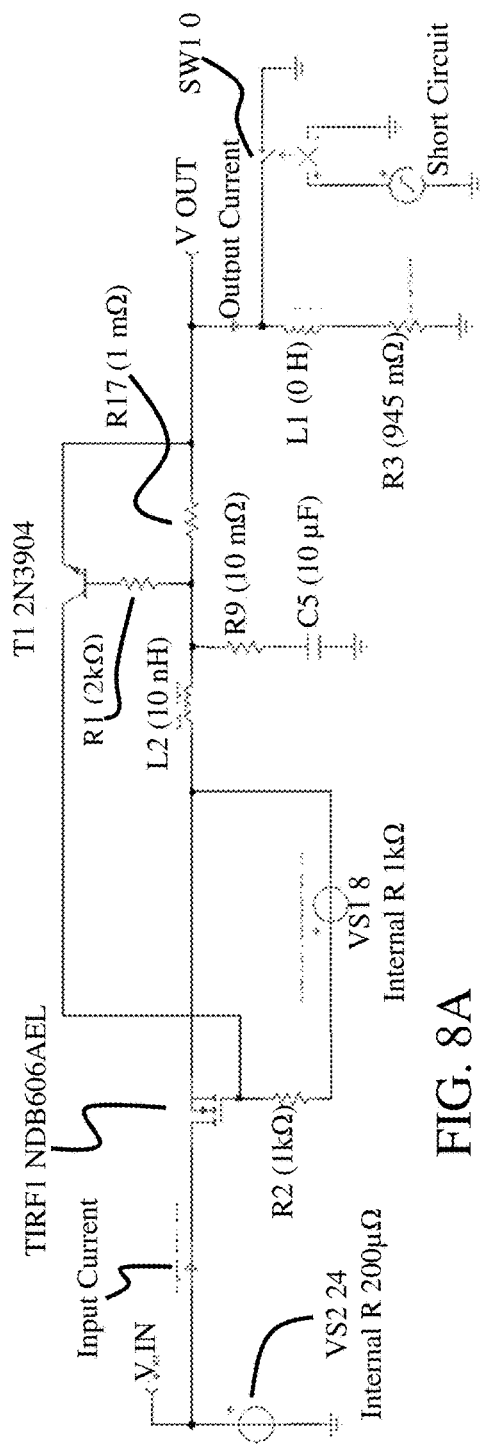
Figure 8C:
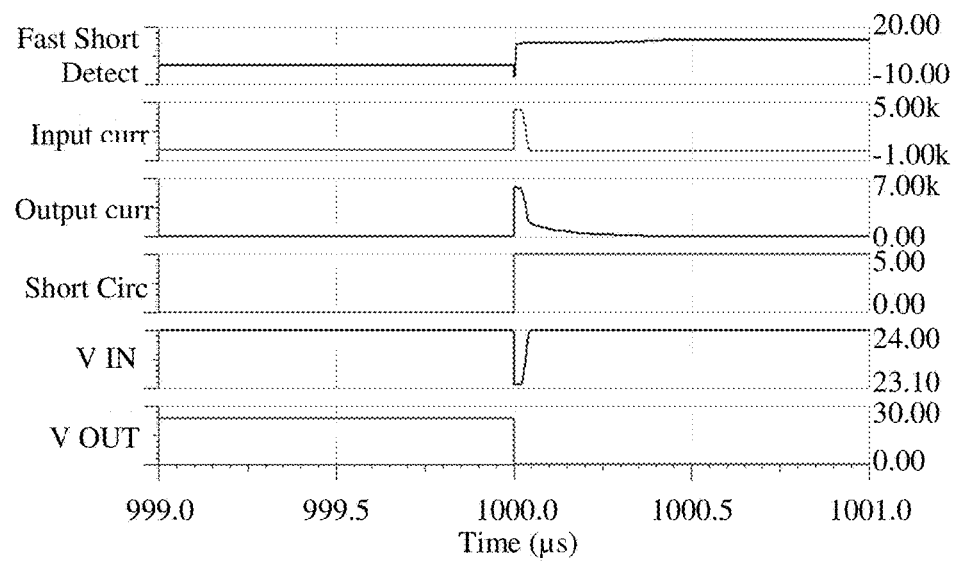

FIGS. 8B and 8C present graphs showing the calculated values of relevant voltages and currents as a function of time following a short circuit in the circuit shown in FIG. 8A. The results shown graphically in FIG. 8B demonstrate that the input and therefore the MOSFET current remain below 100 A, well below the maximum current that a small power MOSFET can experience without damage, even when a small (10 nH) inductor is used. FIG. 8C presents the results of analogous calculations for a circuit identical to that in FIG. 8A except that the circuit does not contain an inductor. As shown in the graphs, in this case, the input and therefore the MOSFET are above 4750 A, which is far above the upper limit of usability even for a high power MOSFET. These results clearly demonstrate the utility of the PPSE disclosed herein.

Figure 8D:
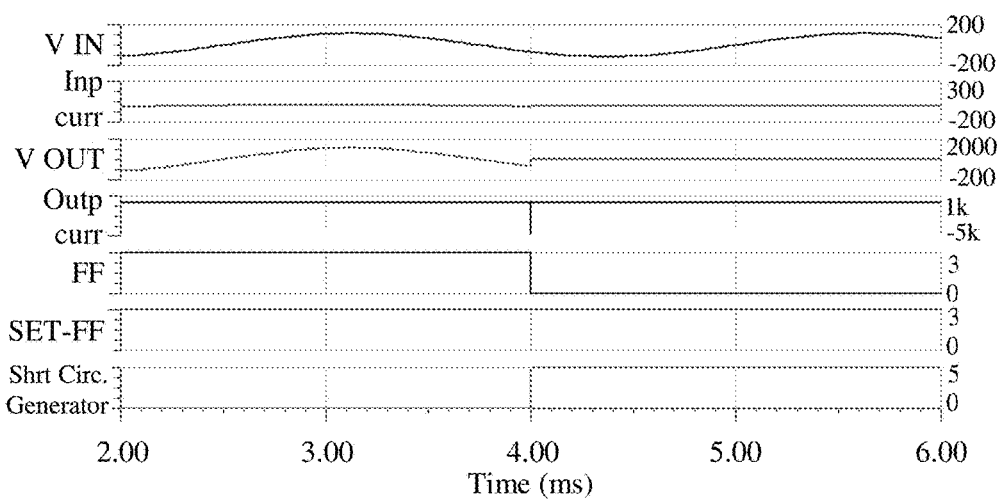

FIG. 8D shows another example of the short circuit behavior of the PPSE herein disclosed, in this case, a 4 ms short circuit in the negative input signal of a 400 Hz, 115 V AC power system. As can be seen in the figure, the short circuit generates a current to the load of ~5 kA, but the input current remains constant at −13 A.

Additional advantages and benefits of the invention disclosed herein over the prior art will be clear to a person of ordinary skill in the art.

The invention claimed is:

1. A programmable power switching element (PPSE) comprising:
a first terminal;
a front power transistor comprising a drain connected in series to said first terminal, a source, and a gate;
a first gate driver connected to said gate of said front power transistor;
a main switching transistor connected in series with said front power transistor, said main switching transistor comprising a drain, said drain connected to said source of said front power transistor;
a first reverse current blocking transistor, comprising a drain, a source, and a gate, said first reverse current blocking transistor connected in series with and located between said front power transistor and said main switching transistor, the gate of said first reverse current blocking transistor connected to said first gate driver;
a second gate driver connected to a gate of said main switching transistor;
a shunt resistor connected in series with said main switching transistor;
a second terminal in series with said shunt resistor;

a second reverse current blocking transistor, comprising a drain, a source, and a gate, said second reverse current blocking transistor connected in series with and located between said main switching transistor and said shunt resistor, the gate of said second reverse current blocking transistor connected to the second gate driver;
a charge storage capacitor connected between ground and a junction, wherein said junction is between said source of said second reverse current blocking transistor and said shunt resistor;
an inductor located between said source of said second reverse current blocking transistor and said charge storage capacitor;
an NPN transistor comprising a collector and an emitter, said collector connected to said gate of said front power transistor and said emitter connected to said second terminal via said shunt resistor and said inductor;
a current measurement element comprising a bidirectional shunt voltage amplifier, said current measurement element connected in parallel with said shunt resistor; and
a high-speed microcontroller unit (MCU) comprising a high-speed A/D converter connected to said front power transistor, said main switching transistor, said first reverse current blocking transistor, and said second reverse current blocking transistor, to said charge storage capacitor, and to said voltage amplifier.

2. The PPSE according to claim 1, comprising a gate driver high speed memory device configured to be reset when a voltage is created on said emitter of said NPN transistor upon current flow through said shunt resistor due to discharge of said storage capacitor, thereby disconnecting said main switching transistor and said second reverse current blocking transistor from a source of current.

3. The PPSE according to claim 1, wherein:
said PPSE comprises a light source;
said NPN transistor is a phototransistor optically coupled to said light source; and
said current measurement element is configured to measure AC current.

4. The PPSE according to claim 3, wherein said light source comprises two LEDs connected in parallel in opposite directions.

5. The PPSE according to claim 1, wherein at least one of the following:
at least one of said front power transistor, said main switching transistor, said first reverse current blocking transistor, and said second reverse current blocking transistor is a MOSFET;
said gate of said first reverse current blocking transistor is connected to said first gate driver;
said gate of said second reverse current blocking transistor is connected to said second gate driver;
said inductor has an inductance of between 10 and 500 nH;
said charge capacitor has a capacitance of between 1 and 50 µF;
said NPN transistor comprises an FT of at least 200 MHz; or any combination thereof.

6. The PPSE according to claim 1, wherein said MCU is programmed to read a voltage drop across said charge storage capacitor; read a voltage rise on said current measurement element; store predetermined current limits for said PPSE; detect a value and a waveform of current flowing through said PPSE; and to send a signal to said front power transistor to direct said front power transistor to open or close.

7. The PPSE according to claim 1, wherein said MCU is programmed to measure a current waveform and to correlate said current waveform with a status of the PPSE.

8. The PPSE according to claim 1, wherein said MCU comprises:
a flash memory;
a random access memory (RAM);
a non-volatile memory;
at least one charge pump driver;
a universal asynchronous receiver-transmitter (UART);
a serial peripheral interface (SPI) bus;
said analog to digital converter; and
a board level interface.

9. The PPSE according to claim 1, wherein said PPSE comprises exactly one main switching transistor.

10. The PPSE according to claim 1, wherein said PPSE comprises two main switching transistors connected in series source to source.

11. A method for determining a location of a short circuit in a system comprising a voltage source and at least one branch current load, said method comprising:
inserting the PPSE of claim 1 into said system between said voltage source and said at least one branch current load;
determining an electrical resistance of said system $R_d$ as a function of distance from said PPSE;
determining a total resistance R by performing a procedure selected from the group consisting of Procedure A and Procedure B, wherein:
Procedure A comprises:
determining an initial voltage $V_0$ across said charge storage capacitor;
determining a capacitance C of said system;
using said PPSE to open at least said front power transistor upon occurrence of said short circuit;
determining a voltage $V_t$ across said charge storage capacitor at time t following said step of using said PPSE to open said circuit; and
determining said total resistance R from $V_t = V_0 e^{-t/RC}$; and
Procedure B comprises:
providing a pulse-width modulated (PWM) input signal, said PWM input signal comprising a predetermined duty cycle, thereby producing an output voltage;
measuring a short-circuit current; and
determining said total resistance R from said short-circuit current and said output voltage; and
determining said location by calculating $R/R_d$.

12. A programmable power switching element (PPSE), comprising:
a first terminal;
a first main switching transistor comprising a drain connected in series to said first terminal, a source, and a gate;
a gate driver connected to said gate of first main switching transistor;
a second main switching transistor connected in series with said first main switching transistor, said second main switching transistor comprising a drain, said drain connected to said source of said first main switching transistor;
a shunt resistor connected in series with an inductor;
a junction between said source of said second main switching transistor and said shunt resistor;
a charge storage capacitor connected between ground and said junction;

said inductor located between said source of said second main switching transistor and said charge storage capacitor;

a second terminal connected in series to said shunt resistor;

an NPN transistor comprising a collector and an emitter, said collector connected to said gate of said first main switching transistor, and said emitter connected to said second terminal via said shunt resistor and said inductor;

a current measurement element comprising a voltage amplifier connected in parallel to said shunt resistor; and a high-speed microcontroller unit (MCU), comprising:
a programmable delay unit; and
a high-speed A/D converter connected to said first main switching transistor and said second main switching transistor, to said charge storage capacitor, and to said voltage amplifier.

13. The PPSE according to claim 12, comprising a gate driver high speed memory device configured to be reset when a voltage is created on said emitter of said NPN transistor upon current flow through said shunt resistor due to discharge of said storage capacitor, thereby disconnecting said first main switching transistor and said second main switching transistor from a source of current.

14. The PPSE according to claim 12, wherein:
said PPSE comprises a light source;
said NPN transistor is a phototransistor optically coupled to said light source; and
said current measurement element is configured to measure AC current.

15. The PPSE according to claim 12, wherein at least one of the following:
at least one said first main switching transistor and said second main switching transistor is a MOSFET;
said inductor has an inductance of between 10 nH and 100 µH;
said charge capacitor has a capacitance of between 1 and 50 µF;
said NPN transistor comprises an FT of at least 200 MHz;
or any combination thereof.

16. The PPSE according to claim 12, wherein said MCU is programmed to read a voltage drop across said charge storage capacitor; read a voltage rise on said current measurement element; store predetermined current limits for said PPSE; detect a value and a waveform of current flowing through said PPSE; and to send a signal to said first main switching transistor to direct said first main switching transistor to open or close.

17. The PPSE according to claim 12, wherein said MCU is programmed to measure a current waveform and to correlate said current waveform with a status of the PPSE.

18. The PPSE according to claim 12, wherein said MCU comprises:
a flash memory;
a random access memory (RAM);
a non-volatile memory;
at least one charge pump driver;
a universal asynchronous receiver-transmitter (UART);
a serial peripheral interface (SPI) bus;
said analog to digital converter; and
a board level interface.

19. A method for determining a location of a short circuit in a system comprising a voltage source and at least one branch current load, said method comprising:
inserting the PPSE of claim 12 into said system between said voltage source and said at least one branch current load;
determining an electrical resistance of said system $R_d$ as a function of distance from said PPSE;
determining a total resistance R by performing a procedure selected from the group consisting of Procedure A and Procedure B, wherein:
Procedure A comprises:
determining an initial voltage $V_0$ across said charge storage capacitor;
determining a capacitance C of said system;
using said PPSE to open at least said first main switching transistor upon occurrence of said short circuit;
determining a voltage $V_t$ across said charge storage capacitor at time t following said step of using said PPSE to open said circuit; and
determining said total resistance R from $V_t = V_0 e^{-t/RC}$; and
Procedure B comprises:
providing a pulse-width modulated (PWM) input signal, said PWM input signal comprising a predetermined duty cycle, thereby producing an output voltage;
measuring a short-circuit current; and
determining said total resistance R from said short-circuit current and said output voltage; and
determining said location by calculating $R/R_d$.

* * * * *